United States Patent [19]

Young

[11] Patent Number: 4,703,269
[45] Date of Patent: Oct. 27, 1987

[54] NUCLEAR MAGNETIC RESONANCE IMAGING METHODS AND APPARATUS

[75] Inventor: Ian R. Young, Sunbury-on-Thames, England

[73] Assignee: Picker International Ltd., Wembley, England

[21] Appl. No.: 895,895

[22] Filed: Aug. 12, 1986

[30] Foreign Application Priority Data

Sep. 2, 1985 [GB] United Kingdom ............... 8521791

[51] Int. Cl.$^4$ ............................................ G01R 33/20
[52] U.S. Cl. .................................................. 324/309
[58] Field of Search ........................ 324/307, 309, 311

[56] References Cited

U.S. PATENT DOCUMENTS 4,536,712  8/1985  Iwaoka et al. ..................... 324/309
4,563,647  1/1986  Young ................................ 324/309
4,587,488  5/1986  Young ................................ 324/309

OTHER PUBLICATIONS

E. L. Hahn, "Spin Echoes", *Phys. Rev.*, vol. 80, No. 1, Nov. 1950, pp. 580–594.

*Primary Examiner*—Stewart J. Levy
*Assistant Examiner*—Kevin D. O'Shea
*Attorney, Agent, or Firm*—Timothy B. Gurin

[57] ABSTRACT

A nuclear magnetic resonance imaging method and apparatus using the Hahn spin echo technique wherein dephasing of spins due to selection field gradients (G1x, G2x, G3x) applied during the radio frequency excitation pulses (B1 (90°), B2 (90°), B3 (90°)) of the Hahn technique is corrected solely by magnetic field gradients ($-G'x$, $-G2'x$) applied before the last radio frequency excitation pulse.

6 Claims, 4 Drawing Figures

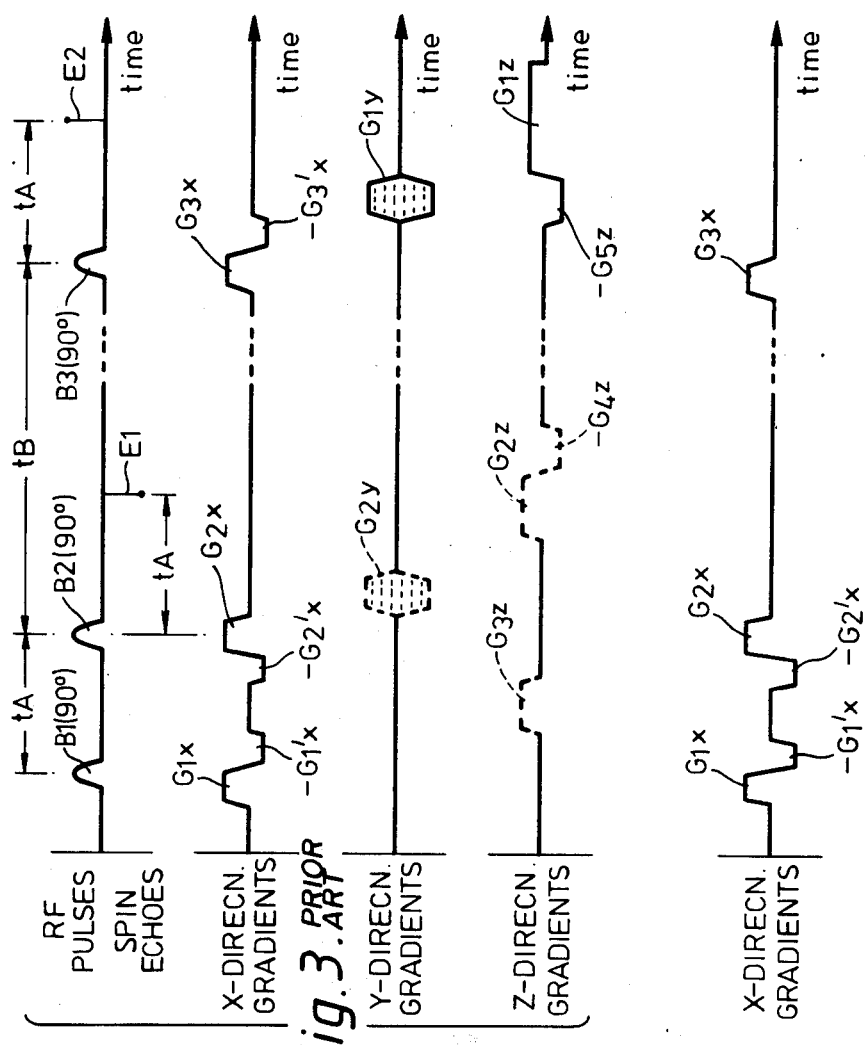
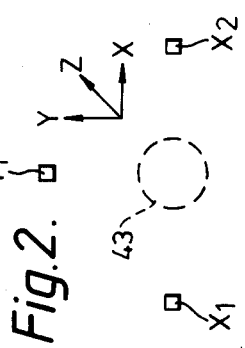

NUCLEAR MAGNETIC RESONANCE IMAGING METHODS AND APPARATUS

This invention relates to nuclear magnetic resonance (NMR) imaging methods and apparatus.

In NMR imaging methods, nuclear spins are preferentially excited in a selected region of a body under examination, and the spins are then detected. The preferential excitation is normally achieved by applying a radio frequency (RF) magnetic field pulse to the body in the presence of a strong, steady, homogeneous magnetic field on which a selection gradient is imposed during excitation, and in order to enable signals from different parts of the selected region to be separately identified, further magnetic field gradients are imposed between excitation and detection and/or during detection.

When nuclear spins are excited in a body, they are initially in phase but will immediately start to lose phase coherence due both to inhomogeneities in the applied magnetic fields, and to interaction between adjacent spins, this phenomenon being known as spin-to-spin relaxation. The effect of spin-to-spin relaxation due to field inhomogeneities, but not that due to adjacent spins, may be eliminated by a so-called spin echo technique wherein at a suitable time T after excitation the spin axes are simultaneously reversed so that after a further period T the spins have rephased due to field inhomogeneities by the reverse of the process by which they lost phase coherence up to the time the spin axes were reversed. In this way it becomes possible to obtain a measure of spin-to-spin relaxation time T2 due to interaction of adjacent spins only.

In a well known spin echo technique devised by E. L. Hahn, hereinafter referred to as the Hahn spin echo technique, spin echoes are achieved by first applying an RF pulse whereby the nuclear spins in a body are tipped from a first equilibrium direction normally designated the Z-direction defined by the applied steady homogeneous magnetic field, to a plane at 90° to the Z direction, i.e. into the X-Y plane, the spins then precessing in the X-Y plane around the Z-axis. Such an RF pulse for obvious reasons is hereafter referred to as a 90° RF pulse.

The Hahn technique proceeds by the application of a second 90° RF pulse at a time tA after the first pulse and a third 90° RF pulse at a time tB after the second pulse, the time tB being greater than tA. This sequence of RF pulses produces a series of five spin echoes at times after the first pulse of 2tA, tB+2tA, 2tB−2tA, 2tB and 2tB+2tA respectively.

Such a sequence enables useful measurements of the spin-spin relaxation time constant T2 to be made, and therefore when used in an imaging technique allows good differentiation between regions of a body consisting of materials having different values of T2.

For imaging purposes it is frequently desirable for tA and tB to be chosen so that the detected spins also allow good differentiation between regions of the body consisting of materials having different values of T1, the spin-lattice relaxation time constant, that is the time which the spins take to relax back after excitation to the equilibrium direction, i.e. the Z-direction. To this end tB is normally made significantly greater than tA.

Unfortunately it is found that when using the Hahn spin echo technique in an NMR imaging process to obtain T1 and T2 information, poor results, more particularly ghost images are frequently obtained.

It is an object of the present invention to prove an NMR imaging method using the Hahn spin echo technique wherein this difficulty is alleviated.

According to the present invention there is provided a nuclear magnetic resonance imaging method wherein a representation of a selected region of a body is produced from data obtained by detection of spin echoes produced by application of first, second and third radio frequency (RF) pulses to the body in turn in the presence of a steady magnetic field defining an equilibrium direction on which is imposed during each RF pulse a respective selection magnetic field gradient to excite spins preferentially in the selected region, the time delay between the second and third RF pulses being such as to allow differentiation between parts of said selected region having different values of spin-lattice relaxation time constant, and dephasing of spins due to said selection gradients being corrected solely by at least one further magnetic field gradient imposed before said third RF pulse.

The invention also provides an apparatus arranged to carry out a method according to the invention.

The invention resides in the realisation by the inventor that when the Hahn spin echo technique is used in an NMR imaging method, if tB is significantly larger than tA, as will be the case when good T1 contrast is required, a significant amount of magnetisation has recovered to lie in the equilibrium direction by the time the third RF pulse of the Hahn sequence is applied. As a result, if a magnetic gradient to correct dephasing of wanted spins (which lie in directions other than the equilibrium direction immediately prior to the third RF pulse) by the selection gradient applied during the third RF pulse is applied after the third RF pulse, this phase correction gradient produces a field echo of the magnetisation lying in the equilibrium direction immediately prior to the third RF pulse and excited by the third RF pulse, which field echo interferes with the wanted spin echo signal.

One method and apparatus in accordance with the invention will now be described by way of example with reference to the accompanying drawings in which:

FIGS. 1 and 2 illustrate the apparatus diagrammatically;

FIG. 3 is a diagram illustrating the sequence of steps carried out in a conventional NMR imaging method using the Hahn spin echo technique; and FIG. 4 a diagram illustrating the sequence of steps carried out in a method according to the invention.

Figure 1:
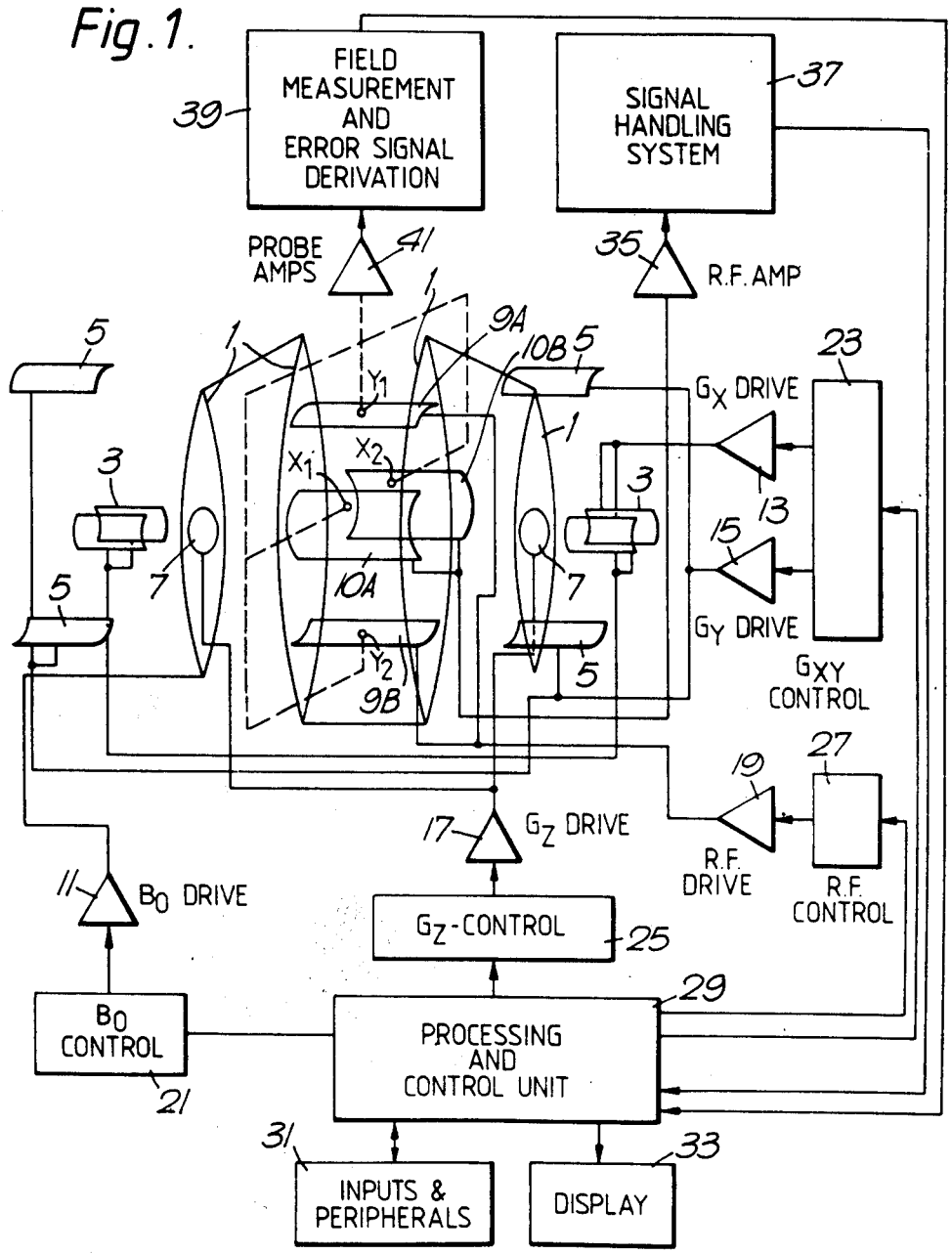

The apparatus is for the most part of conventional form, for example, as described in UK Patent Specifications Nos. 1,578,910 and 2,056,078 and U.S. Pat. Nos. 4,284,948 and 4,355,282.

The basic elements of such an apparatus are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Referring to FIG. 1, the first coil system comprises coils 1 which provide a steady uniform magnetic field Bo in the Z-direction; coils 3 which provide a magnetic field gradient Gx in the X-direction, coils 5 which provide a magnetic field gradient Gy in the Y-direction;

and coils 7 which provide a magnetic field gradient Gz in the Z-direction.

In addition, the apparatus includes a second coil system whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

The second coil system comprises a first coil arrangement comprising a pair of coils 9A and 9B for applying RF fields, and a second coil arrangement comprising coils 10A and 10B for detecting RF fields.

The various coils 1, 3, 5, 7 and 9A and 9B are driven by Bo, Gx, Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 10A and 10B are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

The apparatus also includes field measurement and error signal circuits 39 which receive signals via amplifiers 41 from field probes $X_1$, $X_2$, $Y_1$ and $Y_2$ which are disposed at suitable positions in relation to the body 43 being examined, as illustrated in FIG. 2, to monitor the applied magnetic fields.

A conventional method of operating the apparatus of FIGS. 1 and 2 for NMR imaging of a selected slice of a body using the Hahn spin echo technique will now be described with reference to FIG. 3.

The body to be examined is first positioned in the apparatus so that the region of the body containing the slice to be imaged is subject to the fields produced by the first and second coil systems.

The steady magnetic field Bo is then applied in the Z-direction by means of coils 1, this field serving to define an equilibrium axis of magnetic alignment in the region of the body being examined, i.e. along the Z-direction, and remaining constant throughout the examination procedure.

A magnetic field gradient is then applied in a direction normal to the slice to be imaged by means of coils 3, 5 or 7 as appropriate. For the purposes of the present example the slice is taken to lie in the Y-Z plane so that the applied gradient is in the X-direction and is thus denote by $G_{1x}$ in FIG. 3. Whilst this gradient $G_{1x}$ is being applied an RF magnetic field pulse denoted $B_1$ (90°) is applied. The frequency of the RF pulse is chosen to be at the Larmor frequency of chosen protons, typically hydrogen protons, in the slice of the body to be imaged. Since the strength of the magnetic field and hence the Larmor frequency of the chosen protons outside the slice differs from the frequency of the applied RF pulse, proton spins within the slice only are excited by the RF pulse. The integral of the RF pulse is such that the pulse is just sufficient to tip the spins of the excited protons through 90° i.e. in the present case from the Z-direction into the X-Y plane, the spins then precessing in the X-Y plane around the Z-axis.

The applied magnetic field gradient $G_{1x}$ is then removed and a reverse gradient $-G_1'x$ applied to rephase the spins in the selected slice against dephasing resulting from the gradient across the slice during excitation, as described for example in UK Patent Specification No. 1,578,910 and U.S. Pat. No. 4,284,948.

At a time tA after the first RF pulse $B_1$ (90°) a second RF pulse $B_3$ (90°) identical to the first RF pulse is applied, the pulse $B_2$ (90 ) being accompanied by a second slice selection magnetic field gradient $G_{2x}$ identical to the first applied magnetic field gradient $G_{1x}$. In this case, however, rephasing is effected by a preceding reverse gradient $-G_2'x$, identical to gradient $-G_1'x$, rather than by a subsequent reverse gradient.

At a time tB after the second RF pulse $B_2$ (90°) a third RF pulse $B_3$ (90°) identical to the two preceding RF pulses $B_1$ (90°) and $B_2$ (90°) is applied, tB being chosen to be a large fraction of the spin-lattice relaxation time constant T1 of the material in the slice, and being significantly greater than tA. The third pulse is accompanied by a third slice selection magnetic field gradient $G_{3x}$ identical to the first and fourth applied gradients $G_{1x}$ and $G_{2x}$, and is immediately followed by a rephasing gradient $-G'_{3x}$, as in the case of the first RF pulse $B_1$ (90°).

The method as so far described produces spin echoes at times 2tA, tB+2ta, 2tB−2tA, 2tB and 2tB−2tA in known manner, the first and second spin echoes $E_1$ and $E_2$ only being indicated in FIG. 3.

For imaging, the spin echo signals must be encoded in known manner to enable the signals arising from different parts of the slice to be distinguished from one another.

This is achieved by the application of magnetic field gradients in the plane of the slice after excitation and before and/or during detection of the spins, the particular gradients used depending on the method to be employed to construct an image from the detected signals.

For example, where a two dimensional Fourier Transformation (2DFT) technique is used to construct the image, the second spin echo signals may be encoded by a phase encoding magnetic field gradient pulse $G_{1y}$ applied after the third RF pulse $B_3$ (90°) and a frequency encoding magnetic field gradient $G_{1z}$ applied during detection of the second spin echo signal, as shown in FIG. 3. To obtain a full set of data for an image, the excitation and detection sequence is repeated a number of times with different values of the phase encoding gradient $G_{1y}$.

If a projection image construction technique is used a frequency encoding gradient during spin echo detection only is employed and the excitation and detection sequence repeated for different directions of the encoding gradient in the slice.

Where other spin echo signals are to be detected and used to construct an image, similar encoding gradients must of course be employed to encode these other spin echoes, as indicated by phase encoding gradient pulse $G_{2y}$ and frequency encoding gradient $G_{2z}$ shown dotted in FIG. 3.

In order to avoid time shift of the spin echoes by the applied frequency encoding gradient, further gradients $G_{3z}$, $-G_{4z}$ and $-G_{5z}$ in the Z-direction may be applied in known manner, as shown in FIG. 3.

In the method according to the present invention to be described by way of example, the sequence of steps is as shown in FIG. 3 except that, as shown in FIG. 4, the rephasing gradient $-G_3'x$ is omitted and the integrals of the rephasing gradients $-G_1'x$ and $-G_2'x$ ae altered.

The gradients $-G_1'x$ and $-G_2'x$ are chosen so that the sum of the integrals of these two gradients alone is sufficient to effect any required rephasing against dephasing produced by the selection gradients $G_{1x}$, $G_{2x}$, and $G_{3x}$ of the spins initially excited by the first RF pulse $B_1(90°)$. Hence, a third rephasing gradient after the third RF pulse $B_3(90°)$ is no longer required.

The omission of a third rephasing gradient after the third RF pulse prevents rephasing of any spins aligned with the Z-axis immediately prior to the third RF pulse and excited, i.e. tipped into the X-Y plane, by the third RF pulse. As a consequence of not being rephased, such spins will have become totally dephased well before the second spin echo forms and therefore will not be detected.

It will be appreciated in this connection that the spins which were excited by the first RF pulse and have not relaxed to the Z-direction immediately prior to the third RF pulse, i.e. the wanted spins, still have relative phases immediately prior to the third RF pulse dependent on the preceding rephasing gradients $-G'_{1x}$ and $-G_2'x$. Hence the wanted spins can be arranged to be rephased after the third RF pulse by suitable choice of gradients $-G_1'x$ and $-G_2'x$.

It will be understood that in a method according to the invention the period tB may be chosen with a view to enhancing T1 information contained in the image obtained without risk of distorting the image in the manner experienced in known imaging methods employing the Hahn spin echo technique.

I claim:

1. A nuclear magnetic resonance imaging method wherein a representation of a selected region of a body is produced from data obtained by detection of spin echoes produced by application of first, second and third radio frequency (RF) pulses to the body in turn in the presence of a steady magnetic field defining an equilibrium direction on which is imposed during each RF pulse a respective selection magnetic field gradient to excite spins preferentially in the selected region, the time delay between the second and third RF pulses being such as to allow differentiation between parts of said selected region having different values of spin-lattice relaxation time constant, and dephasing of spins due to said selection gradients being corrected solely by at least one further magnetic field gradient imposed before said third RF pulse.

2. A method according to claim 1 wherein two said further magnetic field gradients are imposed each associated with a respective one of the selection gradients imposed during said first and second RF pulses.

3. A method according to claim 2 wherein said further gradients are imposed one before and one after the respective associated selection gradient.

4. A nuclear magnetic resonance imaging apparatus comprising: means arranged to apply a steady magnetic field to a body; means arranged to apply in turn first, second and third radio frequency (RF) pulses to said body; means arranged to apply a gradient field to said body during each said RF pulse in a direction normal to the plane of a selected slice of said body, thereby to cause said RF pulses to excite spins preferentially in said slice; means arranged to apply before said third RF pulse at least one gradient field in said direction to correct dephasing of spins due to said gradient fields applied during said RF pulses; means for detecting spin echoes of the spins excited in said slice; and means for utilising the resulting data to produce an image of said slice.

5. An apparatus according to claim 4 wherein said means arranged to apply at least one gradient field is arranged to apply two gradient field pulses each associated with a respective one of the selection gradients imposed during said first and second RF pulses.

6. An apparatus according to claim 5 wherein said two gradient field pulses are applied one before and one after the respective associated selection gradient.

* * * * *